(12) United States Patent
Kao

(10) Patent No.: US 6,757,352 B1
(45) Date of Patent: Jun. 29, 2004

(54) REAL TIME CLOCK WITH A POWER SAVING COUNTER FOR EMBEDDED SYSTEMS

(75) Inventor: Min-Cheng Kao, Taipei (TW)

(73) Assignee: Faraday Technology Corp., Hsin-chu (TW)

( * ) Notice: Subject to any disclaimer, the term of this patent is extended or adjusted under 35 U.S.C. 154(b) by 23 days.

(21) Appl. No.: 10/248,189

(22) Filed: Dec. 25, 2002

(51) Int. Cl.$^7$ ............................................. H03K 21/00

(52) U.S. Cl. .................. 377/49; 377/106; 377/107; 327/297

(58) Field of Search .................. 377/49, 106, 107; 327/297

(56) References Cited

U.S. PATENT DOCUMENTS 6,208,705 B1 * 3/2001 Lomazzi et al. .............. 377/26

* cited by examiner

Primary Examiner—Margaret Wambach
(74) Attorney, Agent, or Firm—Winston Hsu

(57) ABSTRACT

A real time clock counter includes a serially connected plurality of register units, each register unit having a bit register for storing clock data, a half adder for incrementing the clock data stored in the bit register, and an activation circuit for activating the bit register. Each activation circuit includes a first input for receiving an oscillating timing signal and a second input for receiving a binary carry term from the previous bit register unit's half adder. Each activation circuit also includes an output for outputting a first activation signal or a second activation signal according to the first value and the oscillating timing signal such that when the activation circuit outputs the first activation signal, the bit register is activated, and when the activation circuit outputs the second activation signal, the bit register is not activated, saving power.

15 Claims, 4 Drawing Sheets

REAL TIME CLOCK WITH A POWER SAVING COUNTER FOR EMBEDDED SYSTEMS

BACKGROUND OF INVENTION

1. Field of the Invention

The present invention relates to a real time clock for embedded systems. More specifically, a real time clock with a power saving counter for embedded systems is disclosed.

2. Description of the Prior Art

FIG. 1 is a block diagram of a bus clock and a 1 Hz. clock domain in an embedded system 10. The bus clock domain operates to control the normal functioning of the embedded system by regulating the transfer rates of data. The 1 Hz. domain clock functions as a long-term timer to control the timing of certain events and can issue an interrupt signal based on the value held within the counter block.

The counter block, also called a register block, typically is a set of bit registers within the domain of the 1 Hz. domain clock that keep track of how many seconds have elapsed since the most recent reset. The counter block conventionally receives a signal supplied by an external 1 Hz. clock and additionally has an input for a reset signal RTC_RSTn.

FIG. 2 is a diagram of prior art counter block 20 of a 1 Hz. clock domain in an embedded system. The counter block 20 comprises 32 bit registers REG0 through REG31 and 32 half adders HA0 through HA31, each half adder uniquely corresponding with one bit register. Each of the bit registers REG0 through REG31 stores a single binary digit of "1" or "0". Each of the half adders HA0 through HA31 is capable of adding two binary digits and outputting a binary sum term and a binary carry term.

For example, if the digits "1" and "1" are added in a half adder, the binary sum term is equal to "0" and the binary carry term is equal to "1". To facilitate written discussion, in this paper, the bit registers and the half adders will be referenced as if in an array. For example, the REG0 will be referenced as REG[0] although the physical makeup of the counter block 20 is not necessarily so.

Each bit register REG[N] comprises a first input for receiving a signal from a 1 Hz. clock, a second input for receiving a binary sum term outputted from the half adder HA[N], and an output for outputting the value of the bit register REG[N] to the corresponding half adder HA[N]. Each half adder HA[N] comprises a first input for receiving the value of the corresponding bit register REG[N], a second input for receiving a binary carry term from the previous half adder HA[N−1], a first output for outputting the binary sum term to the bit register REG[N], and a second output for outputting the binary carry term to the next half adder HA[N+1]. Because the counter block 20 is used to count elapsed seconds, the value of "1" (for 1 second) is inputted into the second input of the half adder HA[0] at the start of each cycle of the 1 Hz. clock.

The counter block 20 operates as follows. Assume that the values in the bit registers REG[0] through REG[31] are all "0". When a rising edge of the 1 Hz clock indicates that one second has elapsed, each bit register REG[N] latches the value supplied at the second input of the bit register REG[N]. In this case, the bit register REG[0] latches the value of "1" (supplied by the "1" inputted to the second input of the half adder HA[0]) and the remaining bit registers REG[1] through REG[31] latch a "0".

Then, the half adder HA[0] receives the binary digit "1" from the bit register REG[0] and the value "1". After performing the addition, the half adder HA[0] outputs the binary sum term "0" to the second input of the REG[0] and outputs the carry term "1" to the half adder HA[1]. The half adder HA[1]) adds the inputted carry term "1" and the "0" outputted from the bit register REG[1]. The addition results in a binary sum term "1" being output to the second input of the bit register REG[1] and a binary carry term of "0" being transmitted on to the half adder HA[2]. The propagation continues sequentially from one bit register REG[N] and half adder HA[N]pair to the next throughout all 32 pairs.

One second later, the 1 Hz. clock triggers another propagation. First, the rising edge of the 1 Hz. clock causes all of the bit registers REG[0] through REG[31] to latch the value at the second input. In this case, the bit register REG[1] will latch a "1" and all of the other bit registers REG[0] through REG[31] will latch a "0". The half adder HA[0] receives the binary digit "0" from the bit register REG[0] and the value "1". After performing the addition, the half adder HA[0] outputs the binary sum term "1" to be stored in the REG[0] and outputs the carry term "0" to the half adder HA[1]. The half adder HA[1] adds the inputted carry term "0" and the "1" inputted from the bit register REG[1], transmits the binary sum term "1" back to the second input of the bit register REG[1], and transmits the binary carry term "0" on to the half adder HA[3] and via propagation throughout the control block 20.

One skilled in the art will quickly notice that all 32 bit registers REG[0] through REG[31] and all 32 half adders HA[0] through HA[31] are activated during each cycle of the 1 Hz. clock. It is also obvious that the vast majority of the values stored in the bit registers REG[0] through REG[31]will not change during any given clock cycle. For example, the value in the bit register REG[15] will change only once in $2^{15}$ seconds or about once in 9 hours even though the same bit register REG[15] is activated for a possible change once every second of those 9 hours. The value of the bit register REG [31] remains unchanged until $2^{31}$ seconds have elapsed, or approximately 68 years.

Power consumption is a critical factor in the design and use of electronic devices. Many embedded systems run off a limited power supply, such as a battery. Unlike the bus clock that shuts off during a power down, the real time clock continues to operate and to draw power. Continuous power consumption by the real time clock shortens the amount of time available between battery recharging or replacement. Even embedded systems that draw power from an outside source can reduce costs by reducing the power consumption of the always-running real time clock.

SUMMARY OF INVENTION

It is therefore a primary objective of the claimed invention to provide a real time clock with a power saving counter for an embedded system.

Briefly summarized, the claimed invention discloses a source of an oscillating timing signal and a serially connected plurality of register units, each register unit having a bit register for storing clock data, a half adder for incrementing the clock data stored in the bit register, and an activation circuit for activating the bit register.

Each bit register includes a first input for receiving an activation signal, a second input for receiving data to be stored within the register, and a first output for outputting the value of the stored data to the corresponding half adder.

Each half adder includes a first input for receiving a first value and a second input for receiving the data stored in the corresponding bit register. In normal practice, the first value is a binary carry term from the previous half adder but it could be any value. Each half adder also includes a first output for outputting a binary sum term to the second input of the bit register and a second output for outputting the binary carry term.

Each activation circuit includes a first input for receiving the oscillating timing signal and a second input for receiving the first value. Again, normally the first value is the binary carry term outputted from the previous bit register unites half adder.

Each activation circuit also includes an output for outputting a first activation signal or a second activation signal according to the first value and the oscillating timing signal such that when the activation circuit outputs the first activation signal, the bit register is activated, and when the activation circuit outputs the second activation signal, the bit register is not activated.

In one example of the claimed invention, the activation circuit performs a logical OR of the inverted first value and the oscillating timing signal to output the first activation signal or the second activation signal, but other circuitry falls within the scope of the invention. The important result is that the activation circuit only activates the bit register if the carry term of the previous bit register unit indicates that the value in the current bit register needs to be changed. If the value in the current bit register does not need to be changed, then the activation circuit does not activate the current register and saves power.

It is an advantage of the claimed invention that by activating a bit register only when that bit register needs to be changed, power is saved. It should be obvious that because the bit register units are serially connected, the serial activation of the bit registers continues to propagate only as far as necessary to correctly update the real time clock. This means that the majority of bit registers are rarely activated and results in an overall power savings approaching 94 percent.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
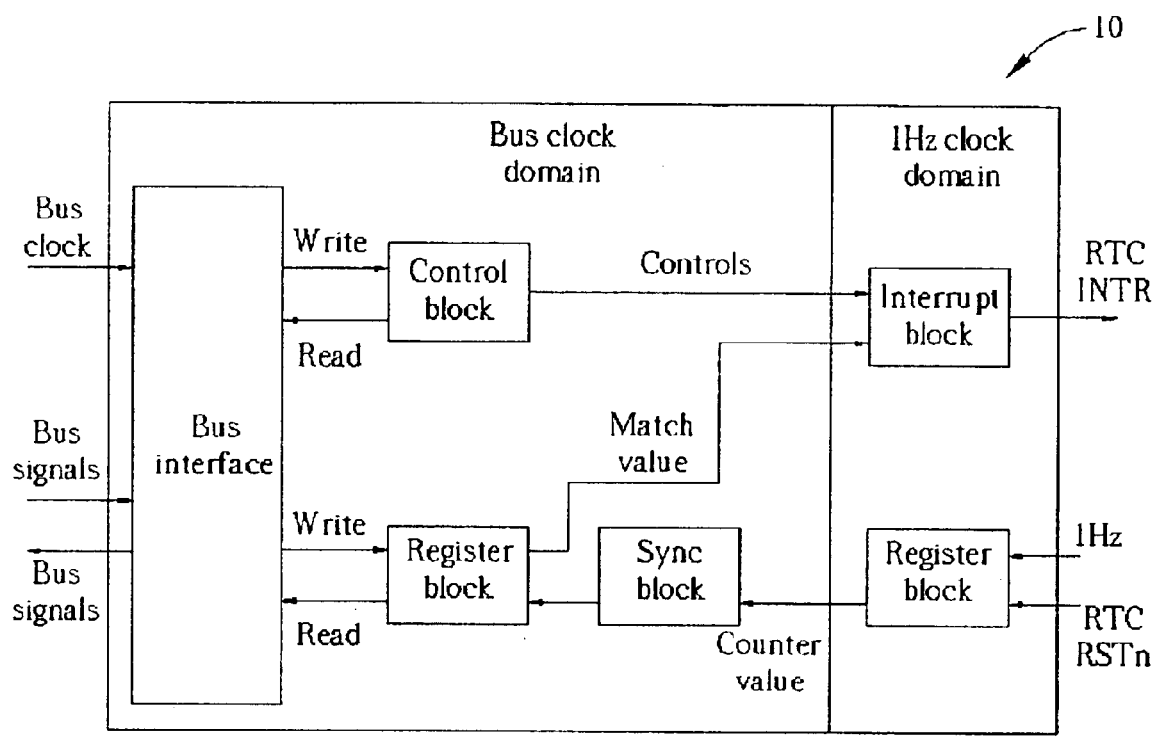
FIG. 1 is a block diagram of bus clock and 1 Hz. clock domains in an embedded system.
Figure 2:
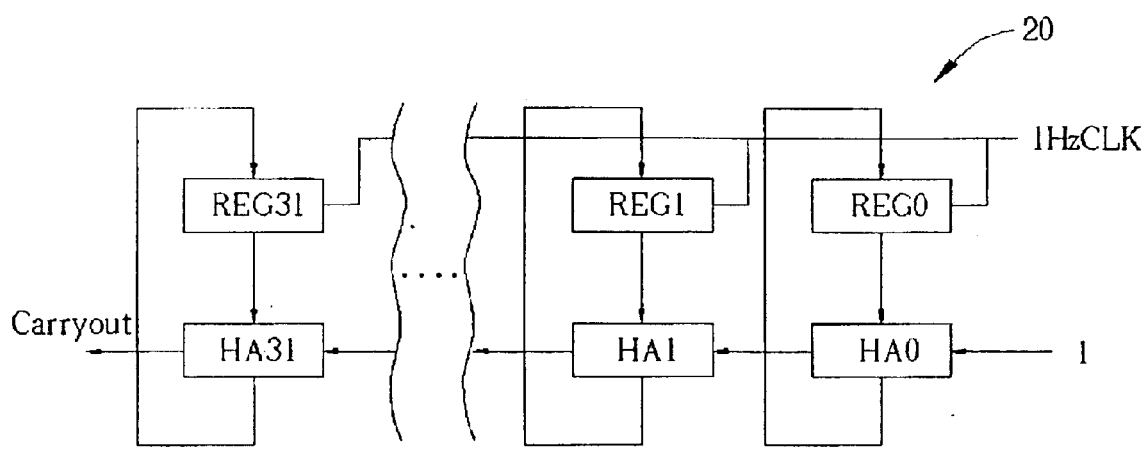
FIG. 2 is a diagram of a counter block of a 1 Hz. clock domain according to a prior art.
Figure 3:
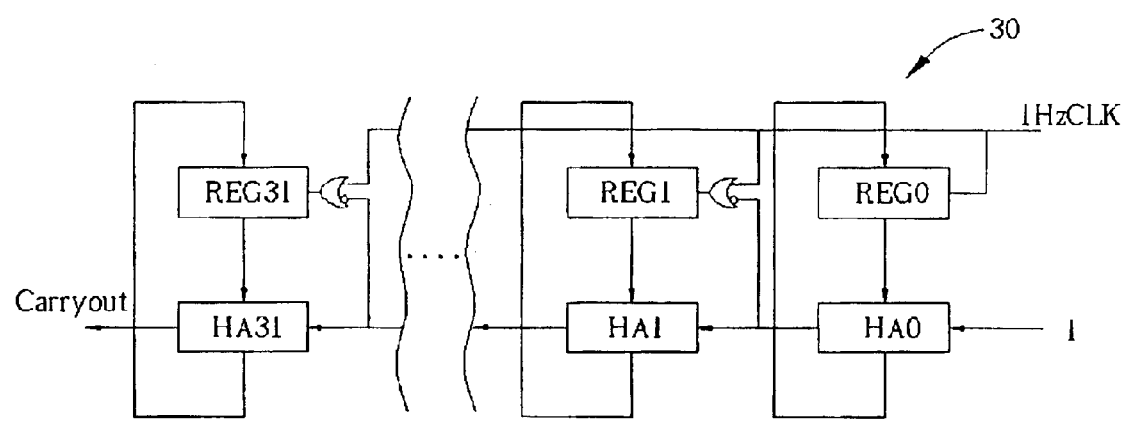
FIG. 3 is a diagram of a counter block of a 1 Hz. clock domain according to the present invention.

FIG. 3 is a diagram of a counter block 30 of a 1 Hz. clock domain in an embedded system according to the present invention. As with the prior art counter block 20, the counter block 30 comprises 32 serially connected bit registers units. Each bit register unit comprises a bit register REG[N], a half adder HA[N], and an activation circuit. Each half adder HA[N]uniquely corresponds with the bit register REG[N]. Each of the bit registers REG[0] through REG[31] latches and stores a single binary digit of "1" or "0" according to a supplied value when an activation signal input from the activation circuit contains a rising edge. It is also possible to use a falling edge trigger in another embodiment of the present invention but only a rising edge trigger will be described here for simplicity. Each of the half adders HA[0] through HA[31] can add two binary digits and output a binary sum term and a binary carry term. For example, if the digits "1" and "1" are added in a half adder HA[n], the binary sum term is equal to "0" and the binary carry term is equal to "1".

Each bit register REG[N] comprises a first input for receiving an oscillating timing signal, a second input for receiving a binary sum term outputted from the half adder HA[n], and an output for outputting the value of the bit register REG[N] to the corresponding half adder HA[N]. Each half adder HA[N] comprises a first input for receiving the value of the corresponding bit register REG[N], a second input for receiving a binary carry term from the previous half adder HA[N−1], a first output for outputting the binary sum term to the bit register REG[N], and a second output for outputting the binary carry term to the next half adder HA[N+1]. Because the counter block 20 is used to count elapsed seconds, a value of "1" (for 1 second) is inputted into the second input of the half adder HA[0].

The most obvious difference between the present invention counter block 30 and the prior art counter block 20 is that the binary carry term outputted from the half adder HA[N]to the next half adder HA[N+1] is also connected to an input of the activation circuit that outputs an activation signal to the first input of the next bit register REG[N+1]. Another input of the activation circuit receives the oscillating timing signal from the 1 Hz. clock. In one embodiment of the present invention, the activation circuit performs a logical OR on the oscillating timing signal and the inverted received binary carry term and issues a first activation signal or a second activation signal based on the results of the operation.

In this example, if a rising activation signal is received by the bit register REG[N], the bit register REG[N] will activate and latch the value supplied to the second input of the bit register REG[N]. If the second activation signal is received by the bit register REG[N], the bit register REG[N] will not activate and not latch the value supplied to the second input of the bit register REG[n] because the second activation signal (not containing a rising edge signal) indicates that the value stored in the bit register REG [N] will not change.

It is well known in the art that if the half adder HA[N] outputs a binary carry term of "0", the half adder HA[N+1] will also output a binary carry term of "0", as will the half adder HA[N+2] and so on throughout the balance of the propagation. If the binary carry term inputted into the half adder HA[N] is a "0", the binary sum term outputted to be stored in the bit register REG[N] will not differ from the value already stored in the bit register REG[N]. Once a binary carry term of "0" has been detected from the half adder HA[N], it is assured that there will be no changes to the values in any of the bit registers REG[N+1] through REG[31].

Therefore, there is no need to waste power to activate the bit registers REG[N+1] to REG[31] because it is known that the stored values will not change. By combining the 1 Hz. clock signal and the binary carry term in the activation circuit and using the output of the activation circuit to serve as an activation signal for the next bit register REG [N], only bit registers REG[N] whose value may change during any given clock cycle will be activated. Activating only the needed bit registers REG[N] results in a savings of power as high as 31/32 or over 96 percent during every odd-numbered clock cycle. Obviously, the saving will be less dramatic during even-numbered clock cycles because more than one bit register REG[N] will change value, but the combined total power savings of the counter block 30 when compared with the prior art counter block 20 approaches 94 percent.

The counter block 30 operates as follows if the values in the bit registers REG[0] through REG[31] have all been reset to "0". All of the activation circuits for the bit registers REG[1] through REG[31] will be issuing a second activation signal because all of the binary carry terms are currently "0", which when inverted, cause the activation circuit to issue a high signal, not a rising edge signal. Additionally, the second input of the bit register REG[0] is supplied a value of "1" via the binary sum term from the half adder HA[0].

Therefore, when the 1 Hz clock indicates that one second has elapsed, only the bit register REG[0] will receive a first activation signal, that of a rising edge and latch the value of "1" supplied at the second input. Next, the half adder HA[0] receives the binary digit "1" from the bit register REG[0] and the value "1". After performing the addition, the half adder HA[0] outputs the binary sum term "0" to the second input of the REG[0] and outputs the carry term "1" to the half adder HA[1] (which outputs a "1" to the second input of the bit register REG[1 ]) and to the activation circuit outputting to the bit register REG[1]. The other input of the activation circuit receives the oscillating 1 Hz clock signal. Although the inverted carry term received by the bit register unit 1 has changed to a "0", the 1 Hz. clock cycle is still high so that the output of the activation circuit is also still high, the bit register REG[1] does not activate, and the propagation stops. During this cycle, only the bit register REG[0] is activated while the bit registers REG[1] through REG[31] remain inactivated, saving power.

One-half of a second later, the oscillating 1 Hz. clock cycle turns low. For the activation circuit associated with the bit register REG[1], this low clock cycle causes the activation signal to drop from high to low because the inverted binary carry term is also low.

Another one-half second later, the 1 Hz. clock triggers another propagation.

Again, the bit register REG[0] latches the value "0" at the second input of the bit register REG[0]. This time, however, the activation signal for the bit register REG[1] also rises from low to high along with the rising clock signal. This causes the bit register REG[1 ]to latch the value "1" at the second input of the bit register REG[1]. The half adder HA[0] receives the binary digit "0" from the bit register REG[0] and the value "1". After performing the addition, the half adder HA[0] outputs the binary sum term "1" to the second input of the bit register REG[0] and outputs the carry term "0" to the half adder HA[1] and to the activation circuit outputting to REG[1]. The half adder HA [1] adds the inputted carry term "0" and the "1" outputted from the bit register REG[1], transmits the binary sum term "1" back to the second input of the bit register REG[1] and transmits the binary carry term "0" on to the half adder HA[2] and to the activation circuit outputting to the REG[2], where the propagation again stops. In this cycle, only the bit registers REG[0] and REG[1] are activated while the bit registers REG [2] through REG[31] remain inactivated, saving power. It is not difficult for one skilled in the art to understand the workings of the counter block 30 and the power saving scheme disclosed herein by the present invention.

Figure 4:
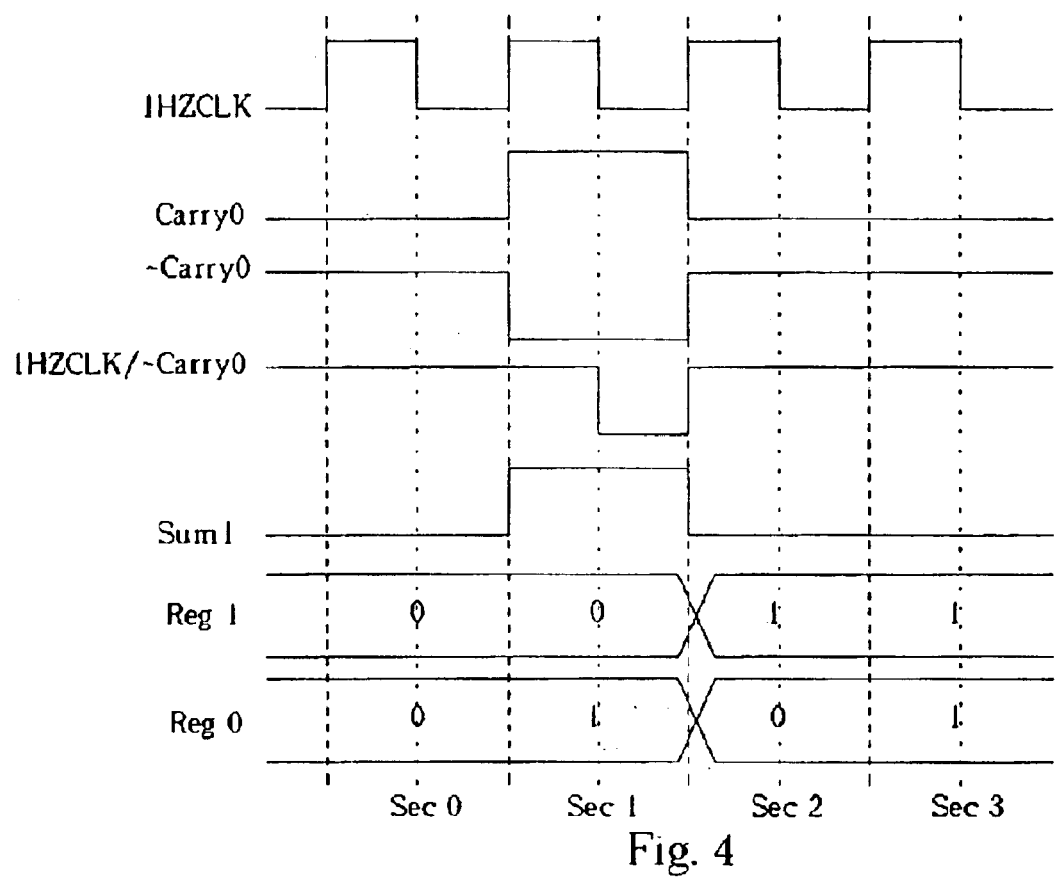
FIG. 4 is a wave-form diagram according to the present invention.

FIG. 4 is a waveform diagram illustrating the workings of the present invention. FIG. 4 shows the oscillating 1 Hz clock cycle, the binary carry term issued from the half adder HA[0], the inverted binary carry term from the half adder HA[0], the waveform output from the activation circuit to the bit register REG[0], and the binary sum term issued from the half adder HA[0] along with the values respectively latched by the bit registers REG[0] and REG[1]. It is clear from FIG. 4 that at the end of "second no.1", that an active edge, here a rising edge, is output from the activation circuit causing the bit register REG[1] to latch the "1" waiting at the second input of the bit register REG[1]). Note that there is no active edge issued from the activation circuit at the end of "second no.0" and the bit register REG[1] is not activated at that time, saving power. One skilled in the art can easily extend this diagram to any number of bit registers REG[N] and any number of seconds to aid in the understanding the operation of the present invention.

The spirit of the present invention is to activate only the bit registers whose value may change during a given cycle and leaving the remaining bit registers inactive to save power. The present invention is not limited to 32 bit counter blocks but will function equally as well with a smaller or larger quantity of bit registers. The example of the FIG. 3 is just that, an example of how to implement the present invention.

In contrast to the prior art, the present invention activates a bit register only when that bit register needs to be changed and thereby power is saved. Because the bit register units are serially connected, the serial activation of the bit registers continues to propagate only until as far as necessary to correctly update the real time clock. As soon as one bit register is not activated, the propagation stops. This means that the majority of bit registers are rarely activated and results in an overall power savings approaching 94 percent.

Those skilled in the art will readily observe that numerous modifications and alterations of the device and method may be made while retaining the teachings of the invention. Accordingly, the above disclosure should be construed as limited only by the metes and bounds of the appended claims.

what is claimed is:

1. A power saving counter for a real time clock in an embedded system, the counter comprising:
   a first bit register for storing digital clock data, the first bit register comprising a first input for activating the first bit register according to an oscillating timing signal and a second input for receiving data to be stored in the first bit register;
   a first half adder for adding a first value to the value of the data stored in the first bit register, the first half adder comprising a first output for outputting a first binary sum term to the second input of the first bit register and a second output for outputting a first binary carry term according to the results of the addition; and
   a second bit register for storing digital clock data, the second bit register comprising a third input connected to an activation circuit for activating the second bit register when indicated by the oscillating timing signal and the first binary carry term.

2. The power saving counter of claim 1 wherein the oscillating timing signal is a 1 Hz clock signal.

3. The power saving counter of claim 1 wherein the second bit register is activated when the oscillating timing signal oscillates from inactive to active and the first binary carry term is active.

4. The power saving counter of claim 3 wherein the activation circuit performs a logical OR of the oscillating timing signal and the inverted first binary carry term.

5. The power saving counter of claim 1 wherein the first value is fixed to an active value.

6. The power saving counter of claim 5 wherein the first value is equal to 1.

7. The power saving counter of claim 1 further comprising a second half adder for adding the first binary carry term to the value of the data stored in the second bit register, for outputting a second binary sum term to the second input of the second bit register, and for outputting a second binary carry term according to the results of the addition.

8. A power saving counter for a real time clock in an embedded system, the real time clock utilizing an oscillating timing signal, the counter comprising:

a plurality of serially connected register units, each register unit comprising:
 a bit register for storing data, the bit register comprising a first input for receiving a first activation signal or a second activation signal;
 a half adder comprising a first input for receiving a first value and a second input for receiving a second value, the second value being the value of the data stored in the bit register, the half adder for summing the first value and the second value and outputting to the next sequentially connected register unit a binary carry term according to the results of the addition to be used as the first value by the next sequentially connected register unit; and
 an activation circuit comprising a first input for receiving the oscillating timing signal, a second input for receiving the first value, and a first output connected to the first input of the bit register for outputting to the bit register the first activation signal or the second activation signal according to the first value and the oscillating timing signal such that when the activation circuit outputs the first activation signal, the bit register is activated, and when the activation circuit outputs the second activation signal, the bit register is not activated.

9. The power saving counter of claim 8 wherein the oscillating timing signal oscillates at approximately 1 Hz.

10. The power saving counter of claim 8 wherein the activation circuit generates the first activation signal when the oscillating timing signal oscillates from inactive to active and the first value is active.

11. The power saving counter of claim 10 wherein the activation circuit performs a logical OR of the oscillating timing signal and the inverted first value.

12. The power saving counter of claim 8 wherein the half adder outputs a binary sum term according to the results of the addition to the bit register of the same register unit for storage.

13. The power saving counter of claim 12 wherein each activated bit register stores the binary sum term outputted by the half adder of the same register unit.

14. A method for saving power in a real time clock counter in an embedded system, the real time clock counter comprising a serially connected plurality of bit register units, each bit register unit comprising a bit register for storing clock data and a half adder for incrementing the data, a carry signal from the half adder being used as an input for the sequentially next half adder, the method comprising:

for each bit register unit accepting a carry signal from a previous bit register unit, activating the bit register only if the carry signal is active; and providing output corresponding to the value held in each active bit register to the corresponding half adder to generate the corresponding carry signal.

15. The method for saving power in a real time clock counter of claim 14 further comprising the half adder of each active bit register outputting to the bit register a binary sum term for storage in the bit register when the half adder sums the carry from the previous bit register unit and the value of the data from the bit register.

* * * * *